United States Patent
Stainsby et al.

(10) Patent No.: US 11,402,449 B2
(45) Date of Patent: Aug. 2, 2022

(54) MAGNETIC RESONANCE IMAGING SYSTEMS AND METHODS

(71) Applicant: SYNAPTIVE MEDICAL INC., Toronto (CA)

(72) Inventors: Jeff Alan Stainsby, Toronto (CA); Chad Tyler Harris, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 0 days.

(21) Appl. No.: 17/114,661

(22) Filed: Dec. 8, 2020

(65) Prior Publication Data

US 2021/0116524 A1    Apr. 22, 2021

Related U.S. Application Data (63) Continuation of application No. 16/449,624, filed on Jun. 24, 2019, now Pat. No. 10,914,802.

(51) Int. Cl.
| | |
|---|---|
| *G01R 33/3815* | (2006.01) |
| *H01F 6/00* | (2006.01) |
| *G01R 33/50* | (2006.01) |
| *G01R 33/38* | (2006.01) |

(52) U.S. Cl.
CPC ..... *G01R 33/3815* (2013.01); *G01R 33/3804* (2013.01); *G01R 33/50* (2013.01); *H01F 6/008* (2013.01)

(58) Field of Classification Search
CPC ............ G01R 33/3815; G01R 33/3804; G01R 33/50; H01F 6/008
See application file for complete search history.

(56) References Cited

U.S. PATENT DOCUMENTS

| | | |
|---|---|---|
| 2014/0002080 A1 | 1/2014 | Den Harder |
| 2015/0362576 A1 | 12/2015 | Jurrissen |
| 2016/0231401 A1* | 8/2016 | Wang ............... A61C 7/125 |

OTHER PUBLICATIONS

Examiner's Report issued by the Intellectual Property Office of the UK in relation to GB Application No. GB2009676.4 dated Dec. 6, 2020, 1 pg.

* cited by examiner

*Primary Examiner* — Gregory H Curran (57) ABSTRACT

A method is provided for magnetic resonance (MR) imaging near metal, including acquiring an image at a first magnetic field from a subject that includes a metal object, acquiring an image at a second magnetic field, and combining the images to provide a corrected image with reduced metal distortion. An MR imaging system for measuring near metal is also provided including a superconducting magnet to provide a magnetic field, a power supply for a current to ramp the magnetic field, a cryocooler in contact with the superconducting magnet, a magnetic field controller programmed to ramp the main magnetic field by adjusting the current generated by the power supply, a radio frequency system for transmitting and receiving signals, and a data acquisition and processing system to receive the MR signals, generate image data sets and combine the image data sets to provide a corrected image having a reduced metal distortion.

20 Claims, 7 Drawing Sheets

MAGNETIC RESONANCE IMAGING SYSTEMS AND METHODS

CROSS-REFERENCE TO RELATED APPLICATION(S)

This document is a continuation application claiming the benefit of, and priority to, U.S. patent application Ser. No. 16/449,624, filed on Jun. 24, 2019, entitled "MAGNETIC RESONANCE IMAGING SYSTEMS AND METHODS," herein incorporated by reference in its entirety.

FIELD

The present disclosure relates to systems and methods for magnetic resonance imaging ("MRI"). More particularly, the present disclosure relates to systems and methods for MRI around metal and/or magnets.

BACKGROUND

Standard MRI begins with the assumption that the magnetic field experienced by protons is relatively uniform over the imaging volume. The presence of materials with different magnetic susceptibilities can cause inhomogeneities in the field experienced by protons over the imaging volume. In particular, materials with large magnetic susceptibility constants, such as metals or magnetic materials, can cause very large inhomogeneities, making it difficult or impossible to image protons in neighborhoods around these substances.

To try to perform MR imaging around metal objects, multi-spectral methods have been proposed and implemented. Advanced imaging around metal methods, such as multi-acquisition with variable resonance image combination (MAVRIC), slice-encoding metal artifact correction (SEMAC) and hybrid approaches, attempt to recover signal from areas around metal by exciting and receiving signal at different frequencies by offsetting the transmit/receive frequency of the resonant frequency (RF) chain. This "tuning" to different resonant frequencies is done by transmitting and receiving with the resonant frequency chain at different narrow bands around different offset frequencies. However resonant frequency chains have a limited operating bandwidth over which they remain tuned and capable of operating (typically less than or equal to 1 MHz), which limits the range of frequencies that can be explored. This limits these methods to only probing frequencies within the tuned range of the RF transmit and receive chain.

SUMMARY

A further understanding of the functional and advantageous aspects of the present disclosure can be realized by reference to the following detailed description and drawings. An aspect of the present disclosure involves providing a system and method for MRI around metal or magnetic objects.

Thus, by one broad aspect of the present disclosure, a method for MRI is provided including acquiring a first image data from a subject with a metal object using an MRI system having a main magnetic field at a first magnetic field strength and using a first transmit frequency, adjusting the main magnetic field of the MRI system to a second magnetic field strength, acquiring a second image data from the subject using the MRI system while the main magnetic field of the MR imaging system is at the second magnetic field strength, and combining the first and second image data to provide a corrected image having a reduced metal distortion.

By a further broad aspect of the present disclosure, a system is provided including a superconducting magnet for generating a main magnetic field, a power supply for providing a current for ramping the main magnetic field, a switch selectively connecting the superconducting magnet to the power supply and having an open state and a closed state, wherein when in the closed state the switch connects the superconducting magnet and the power supply in a connected circuit, a mechanical cryocooler in thermal contact with the superconducting magnet and operable to reduce and maintain a temperature of the superconducting magnet below a transition temperature of the superconducting magnet, a magnetic field controller programmed to ramp the main magnetic field from a first magnetic field strength to a second magnetic field strength by setting a current generated by the power supply to an initial current value, activating the switch to its closed position, thereby connecting the superconducting magnet and the power supply in the connected circuit, adjusting the current generated by the power supply, and activating the switch to its open position when the second magnetic field strength is reached, thereby disconnecting the superconducting magnet and the power supply from the connected circuit and placing the superconducting magnet in a closed circuit, a gradient system positioned about a bore of the superconducting magnet for producing magnetic field gradients, a radio frequency (RF) system for transmitting RF excitation signals and receiving MR signals, a data acquisition system connected to the RF system to receive the MR signals from the RF system, a data processing system configured to receive the MR signals from the data acquisition system, sort the MR signals into a plurality of MR data sets, each MR data set acquired at a distinct magnetic field strength, generate a plurality of image data sets corresponding to the plurality of MR data sets, and combine the plurality of image data sets to provide a corrected image having a reduced metal distortion, a pulse controller connected to the RF system, gradient system and data acquisition system that generates pulse sequences that include RF pulses from the RF system and gradient pulses from the gradient system, and a computer storage for storing the corrected image.

BRIEF DESCRIPTION OF THE DRAWINGS

Embodiments disclosed herein will be more fully understood from the following detailed description taken in connection with the accompanying drawings, which form a part of this application, and in which.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Various apparatuses or processes will be described below to provide examples of embodiments of the imaging method and system disclosed herein. No embodiment described below limits any claimed embodiment and any claimed embodiments may cover processes or apparatuses that differ from those described below. The claimed embodiments are not limited to apparatuses or processes having all of the features of any one apparatus or process described below or to features common to multiple or all of the apparatuses or processes below described.

Furthermore, numerous specific details are set forth in order to provide a thorough understanding of the embodiments described herein. However, understood is that the embodiments described herein may be practiced without these specific details. In other instances, well-known methods, procedures and components have not been described in detail so as not to obscure the embodiments described herein.

Unless defined otherwise, all technical and scientific terms used herein are intended to have the same meaning as commonly understood to one of ordinary skill in the art. Unless otherwise indicated, such as through context, as used herein, the following terms are intended to have the following meanings:

Normal MRI relies on the magnetic field experienced over the imaging volume to be homogeneous. MR methods of spatial encoding (slice selection, phase encoding, frequency encoding) are then applied by perturbing the magnetic field as a function of spatial position in known ways such that the signal from different positions has well-defined characteristics. These encoding methods impose spatially varying magnetic field changes that are usually on the order of <1 kHz per image voxel.

The proton signal, that is normally acquired in MR, precesses at a resonant frequency (RF) that is determined by the magnetic field experienced by protons at each spatial location. Normally this resonant frequency is just a function of the main magnetic field ($H_o$). In the presence of metal objects however, the effective magnetic field experienced by protons becomes a function of the main magnetic field plus the magnetic field perturbation generated by the metal object, i.e., $H_{eff} = H_o + H_{metal}$ where $H_{metal}$ is a function of spatial position, the magnetic susceptibility of the metal, and can itself depend on the main magnetic field strength.

Figure 1:
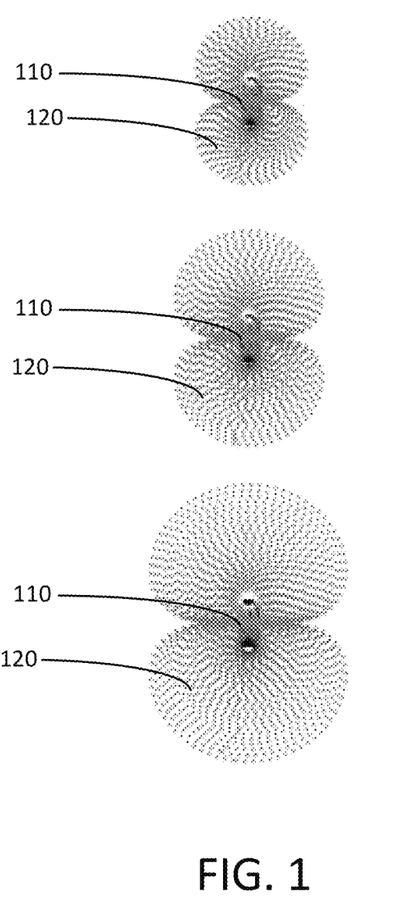
FIG. 1 are contour plots of an object with magnetic susceptibility in a magnetic field, in accordance with some embodiments of the present disclosure.

Referring to FIG. 1, these contour plots illustrate an object 110 with some magnetic susceptibility property within different main magnetic field strengths. Examples of field lines 120 logarithmically spaced between −1 to 1 MHz field variation are shown which are representative of the effects for, from top to bottom, a magnetic field of 0.5 T, 1.5 T and 3.0 T. The effective magnetic field experienced by a proton in the vicinity of the object 110 is dependent not only on the magnetic susceptibility of the object and the proton's position relative to the object, but also on the strength of the main magnetic field.

Still referring to FIG. 1, to try to perform MR imaging around metal objects, existing advanced multi-spectral methods have been proposed and implemented. Advanced imaging around metal methods, such as MAVRIC and SEMAC and hybrid approaches, attempt to recover signal from areas around metal by exciting and receiving signal at different frequencies by offsetting the transmit/receive frequency of the RF chain. Multispectral methods are based on the fact that protons in neighborhoods of metal objects have a resonant frequency given by $H_{eff}$ (not just $H_o$), so by repeating an imaging experiment with the experiment "tuned" to different resonant frequencies, one can obtain information from protons that are experiencing different $H_{eff}$ fields, i.e., at different spatial positions in the neighborhood of metal objects. This "tuning" to different resonant frequencies is done by transmitting and receiving with the resonant frequency chain at different narrow bands around different offset frequencies. However resonant frequency chains have a limited operating bandwidth over which they remain tuned and capable of operating (typically less than or equal to 1 MHz). This limits these methods to only probing frequencies within the tuned range of the RF transmit and receive chain (typically ~1 MHz).

Still referring to FIG. 1, the systems and methods of the present disclosure utilize an MRI system that can be operated to rapidly ramp its main magnetic field strength, thereby allowing for measurements at multiple different field strengths. The main magnetic field is changed using a dynamically rampable magnet instead of, or in conjunction with, changing the transmit/receive offset frequency of the resonant frequency chain. By ramping the main magnet to different field strengths in conjunction with transmit/receive offset frequencies within the hundreds of Hz of optimal tuning range of the RF subsystem, a much larger range of frequencies can be explored. Changing the main magnetic field can allow one to explore a wider range of resonant frequencies, and thus explore protons which are experiencing a wider range of $H_{eff}$ fields. Thus, changing the applied main magnetic field may allow imaging of protons which normally have resonant frequencies outside the range of what can be probed with offset frequencies alone. For example, using a rampable magnet to change the main magnetic field may enable imaging closer to metal objects than existing multi-spectral approaches allow. Using a rampable magnet to change the main magnetic field may also enable imaging in the neighborhood of metal objects with higher magnetic susceptibility constants than can currently be imaged, e.g., near magnetic materials.

Still referring to FIG. 1, for example, at 1.5 T the water proton resonant frequency is: GAMMA*1.5 T=63.855 MHz (GAMMA=42.57 MHz/T for hydrogen). For a material with a magnetic susceptibility of X, a normal system could still detect it if the material distorts the field at/inside that material no more than 0.5 MHz off from the normal resonance, i.e., for GAMMA*(1+X)*1.5 T=(63.855+0.5) MHz, which implies, the limit is for materials with a magnetic susceptibility that is approx. X=0.0078, i.e., 0.0078 times different than water. By ramping the magnetic field down to 0.5 T, the normally tuned RF subsystem would be able to detect protons at/in materials whose magnetic susceptibility satisfies: GAMMA*(1+X)*0.5 T=63.855 MHz, which implies the limit now is for materials with a magnetic susceptibility as high as X=2.0.

Figure 2:
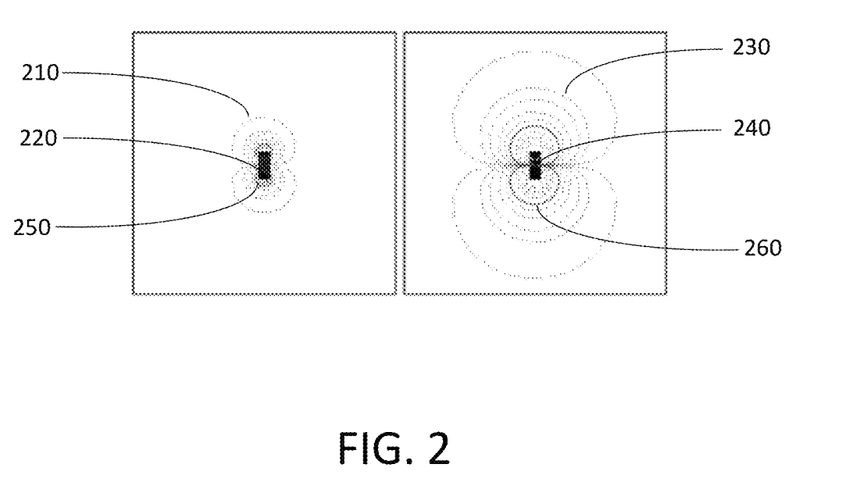
FIG. 2 are contour plots of the magnetic field variation around a metal implant, in accordance with some embodiments of the present disclosure.

Referring to FIG. 2, these contour plots illustrate the magnetic field variation around a metal implant, in accordance with embodiments of the present disclosure. The left panel in FIG. 2 illustrates simulated contour plots 210 around a metal 220 with susceptibility approximately 150 ppm, e.g., titanium implant. The right panel of FIG. 2 illustrates simulated contour plots 230 around a metal 240 with susceptibility approximately 6000 ppm, e.g. non-magnetic stainless steel. A solid line contour 250, 260 represents a 10 kHz variation from the background (main) magnetic field. Contours on both plots are shown with dotted lines 210, 230 for field offsets of 100 Hz, 500 Hz, 1 kHz, 2.5 khz, 5 kHz, 10 kHz, 25 kHz, 50 kHz, 100 kHz, and 300 kHz.

Figure 3:
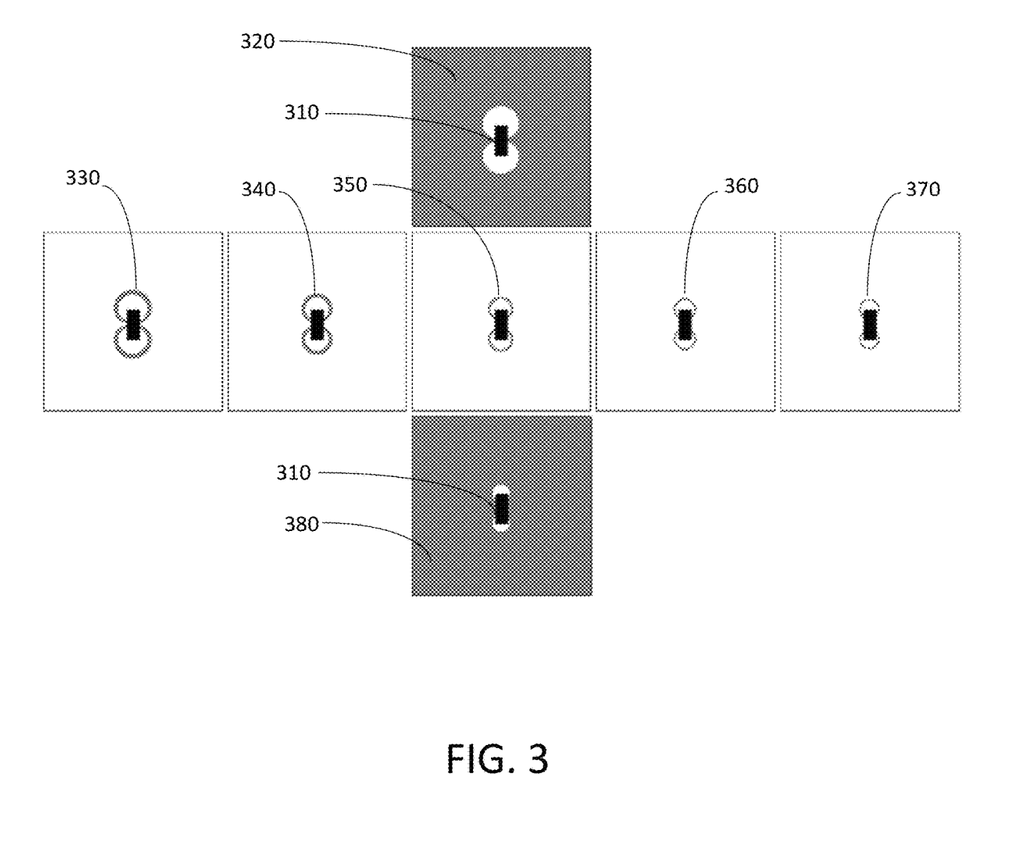
FIG. 3 are plots indicating regions in a medical resonance image where tissue can be imaged in the presence of a metallic implant with a susceptibility of approximately 150 ppm, in accordance with an embodiment of the present disclosure.

Referring to FIG. 3, these plots illustrate regions in a medical resonance image where tissue can be successfully imaged (grey shaded regions) in the presence of a metallic implant (black bar) 310 with a susceptibility of approximately 150 ppm, in accordance with embodiments of the present disclosure. The top image shows the region 320 that can be imaged using typical on-resonance RF excitation pulses, e.g. regions with less than 1 kHz field offset. The middle row images indicate regions 330, 340, 350, 360, 370 that can be imaged using RF excitation pulses offset to frequency bands representative of normal multispectral methods used to image around metal. Frequency bands are, from left to right, 1 kHz-2 kHz, 2 kHz-4 kHz, 4 kHz-6 kHz, 6 kHz-8 kHz, and 8 kHz-10 kHz. The bottom image indicates the region 380 that can be expected to be effectively imaged using existing multispectral (imaging around metal) acquisitions.

Figure 4:
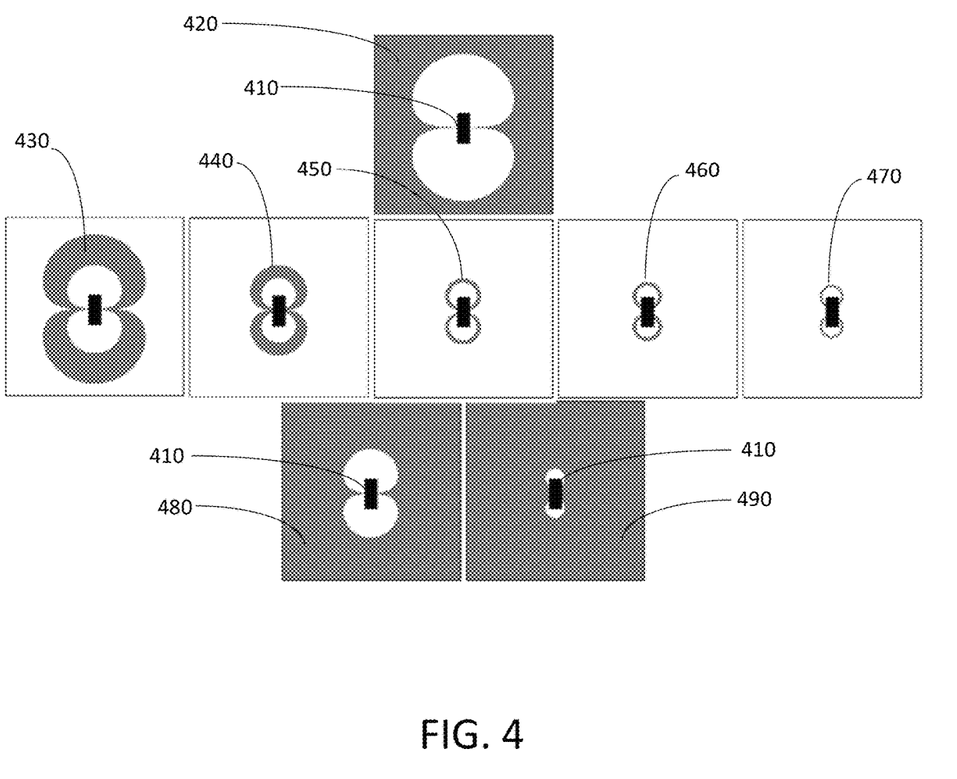
FIG. 4 are plots indicating regions in a medical resonance image where tissue can be imaged in the presence of a metallic implant with a susceptibility of approximately 6000 ppm, in accordance with an embodiment of the present disclosure.

Referring to FIG. 4, these plots illustrate regions in an image where tissue can be successfully imaged (grey shaded regions) in the presence of a metallic implant (black bar) 410 with susceptibility of approximately 6000 ppm, in accordance with embodiments of the present disclosure. The top image shows the region 420 that can be imaged using typical on-resonance RF excitation pulses, e.g., regions with less than 1-kHz field offset. The middle row images indicate regions 430, 440, 450, 460, 470 that can be imaged using RF excitation pulses offset to excite different off-resonance frequency bands. The left-most image represents the region that is typically able to be imaged with existing multispectral methods. The remaining images represent frequency bands at much greater off-resonance bands, namely 10 kHz-50 kHz, 50 kHz-100 kHz, 100 kHz-200 kHz and 200 kHz-300 kHz. Many of these offset frequencies can be more easily accessible by changing the system main magnetic field and using on-resonance RF excitation pulses to ensure peak RF sensitivity and performance. The bottom left image indicates the region 480 that can be expected to be effectively imaged using existing multispectral methods. The bottom right image indicates the region 490 that can be expected to be effectively imaged using broader frequency offset bands that are accessible by changing the main magnetic field during the acquisition of multispectral data. Using multiple magnetic field strengths provides access to a wider range of offset resonant frequencies. It also provides different magnetic field environments to the metal/magnetic material, that may result in different magnetic behavior or $H_{metal}$ of the material. The different responses of the material may identify an optimal magnetic field strength at which to produce an artifact-reduced image.

Figure 5:
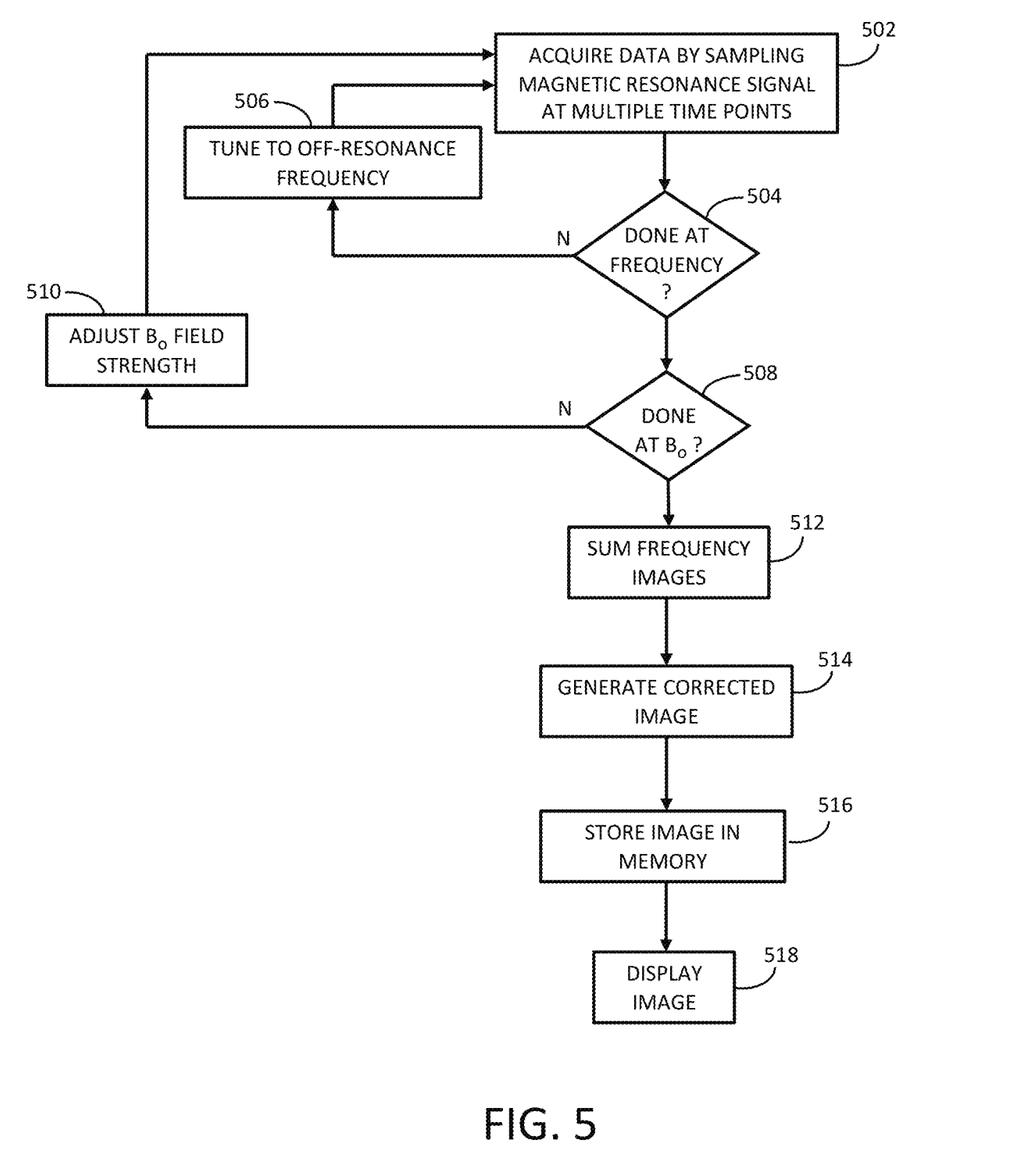
FIG. 5 is a flow diagram illustrating a method for magnetic field-dependent multi-spectral imaging using an MRI system and generating integrated images based on MRI signal data, in accordance with an embodiment of the present disclosure.

Referring to FIG. 5, this flow diagram illustrates the steps of an example method M1 for imaging near metal objects and/or magnets by changing the main magnetic field with or without using multispectral approaches, in accordance with an embodiment of the present disclosure. The method M1 comprises directing the MRI system to perform a pulse sequence that acquires data by sampling a magnetic resonance signal at various time points, as indicated at step 502. In general, the magnetic resonance signal is generated by nuclear spins relaxing back to equilibrium and thus can include a free induction decay ("FID") signal, a gradient echo signal, a spin echo signal, a stimulated echo signal, or any other suitable magnetic resonance signal. In general, the MRI system is operated to generate magnetic resonance signals across a region of the subject, such as an image slice, image slab, image volume, or other spatially localized region-of-interest. Appreciated is that the choice of pulse sequence will influence the type of magnetic resonance signal that is formed and also the relaxation parameter to be studied. For instance, an inversion recovery or T1-weighted pulse sequence may be used for examining longitudinal relaxation, whereas a T2-weighted pulse sequence may be used for examining transverse relaxation.

Still referring to FIG. 5, a determination is made at decision block 504 whether MR data have been acquired at a desired number of frequency bands. If not, the excitation frequency and reception frequency are adjusted, as indicated at step 506 and additional data are acquired at the new offset frequency. For example, data may be collected using on-resonance RF excitation pulses, followed by data collection using offset RF excitation pulses to excite different off-resonance frequency bands. When data have been acquired at all of the desired resonant frequencies, a further determination is made at decision block 508 whether data have been acquired at a desired number of different magnetic field strengths. If not, then the magnetic field strength is adjusted, as indicated at step 510, and additional data are acquired at the new magnetic field strength. Thus, the method M1 comprises acquiring data at least at a first magnetic field strength and a second magnetic field strength; however, the process can be generally repeated to acquire a plurality of data sets at each of a plurality of different magnetic field strengths. Accordingly, in an MRI system, a tunable RF coil may be implemented, such that the RF coil can be tuned to the appropriate resonance frequencies associated with the different magnetic field strengths. Likewise, a broadband receiver can be implemented to provide a wide range of resonance frequencies, and thus field strengths, that can be used in a single scan. Examples of such tunable RF coils and broadband receivers will be appreciated by those skilled in the art.

Still referring to FIG. 5, in another embodiment, a single transmit/receive frequency and bandwidth for each imaging slice is used and the multi-spectral sampling is done solely by changing the main magnetic field strength. This is useful for example where the magnetic material is saturated. A tunable RF system is not needed if the material is saturated such that the magnetic field it produces ($H_{metal}$) does not depend on the background magnetic field ($H_o$). In this case, the excitation bands move as the additive field ($H_{eff}$=background field+material field) moves as the background field changes, but a single transmit/receive frequency and bandwidth is used. This would be the case when imaging around highly magnetic materials such as magnetic stainless steel.

Still referring to FIG. 5, in one specific embodiment, the magnetic field is adjusted using an MRI system that is capable of rapidly ramping up or down its main magnetic field. An example of such a system is described in International Publication No. WO2017/064539 A1, "MAGNETIC RESONANCE IMAGING SYSTEM CAPABLE OF RAPID FIELD RAMPING," the entirety of which is incorporated herein. With this type of system, the main magnetic field can be ramped to different strengths depending on the amount of applied current. Advantageously, the main magnetic field can be ramped in a clinically reasonable amount of time. As one example, the main magnetic field can be ramped from zero to 0.5 T in about ten minutes. As another example, the main magnetic field can be ramped from 0.5 T to 0.4 T in about one minute or less. Thus, in some embodiments, the magnetic field strength of the main magnetic field can be ramped between a first and second value in less than fifteen minutes, and in some embodiments less than two minutes.

Still referring to FIG. 5, using such a system, then, the main magnetic field can be incrementally adjusted to acquire data at multiple different field strengths in a clinically reasonable span of time, thereby providing magnetic field-dependent relaxometry. As one example, the main magnetic field can be adjusted in increments of 0.1 T; however, appreciated is that other increments greater or less than 0.1 T can also be used (e.g., 0.05 T, 0.2 T, 0.25 T, 0.5 T). In some embodiments, the main magnetic field can be further adjusted using a coil insert to modulate the local magnetic field in the MRI system.

Still referring to FIG. 5, when data have been acquired at all of the desired resonant frequencies for each of the desired magnetic field strengths, the acquired data are combined as indicated at step 512. In one embodiment, independent spectral bin images are combined using quadrature summation to form a composite image for the data acquired at each magnetic field strength. Composite images from each magnetic field strength are then combined to provide an integrated image having reduced artifacts produced by the metal or magnet.

Still referring to FIG. 5, in a further embodiment, a frequency image is reconstructed for each MR data set or spectral bin acquired, resulting in a collection of frequency images. To minimize the metal or magnet-induced distortion, the pixels for each of the plurality of MR frequency images may be examined to determine, for each pixel location, which image of the plurality of MR images has the maximum intensity. Each pixel location is assigned the maximum intensity for the corresponding pixel location and that value is used. The frequency images are converted or transformed into temporal images. The plurality of temporal images is used to generate a combined image with reduced metal/magnet-induced artifacts.

Still referring to FIG. 5, in another embodiment, a frequency image is reconstructed for each MR data set or spectral bin acquired at a single magnetic field strength, resulting in a collection of frequency images. To minimize the metal or magnet-induced distortion, the pixels for each of the plurality of MR frequency images may be examined to determine, for each pixel location, which image of the plurality of MR images has the maximum intensity. Each pixel location is assigned the maximum intensity for the corresponding pixel location and that value is used. The frequency images are converted or transformed into temporal images. A combined image for each magnetic field strength is generated based on the plurality of temporal images, and the combined images generated for each magnetic field strength are further combined to generate an image with reduced artifacts. As indicated at step 514, the images are stored in computer memory and at step 516 may be displayed to a user on a computer display.

Still referring to FIG. 5, using multiple magnetic field strengths provides access to a wider range of offset resonant frequencies. It also provides different magnetic strength environments to the metal/magnet material, that may result in varying magnetic susceptibility of the material. The different responses of the material may identify an optimal magnetic field strength at which to produce an artifact-reduced image for that particular material.

Example MRI System

Figure 6:
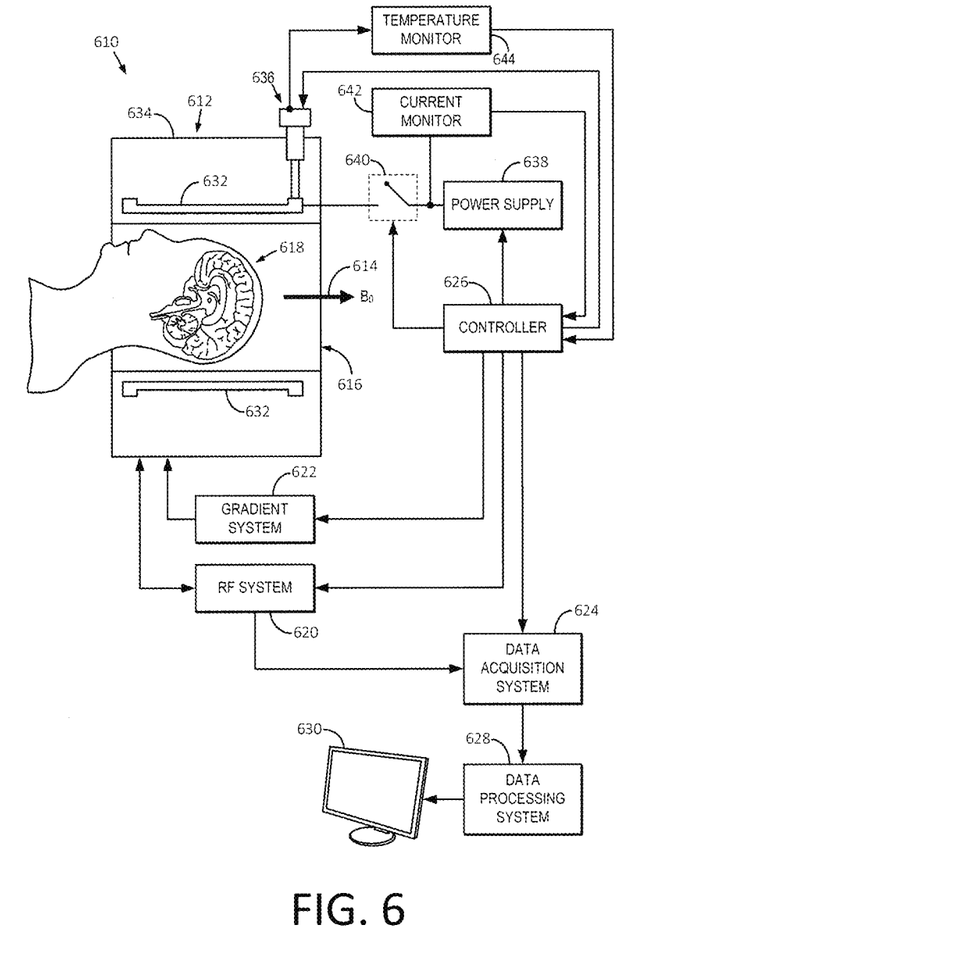
FIG. 6 is a block diagram of an example MRI system that can implement the method of the present disclosure, in accordance with an embodiment of the present disclosure.

Referring to FIG. 6, an example of an MRI system 610 that is capable of rapidly ramping its magnetic field is illustrated. The MRI system 610 generally includes a magnet assembly 612 for providing a magnetic field 614 that is substantially uniform within a bore 616 that may hold a subject 618 or other object to be imaged. The magnet assembly 612 supports a radio frequency ("RF") coil (not shown) that may provide an RF excitation to nuclear spins in the subject 618 or object positioned within the bore 616. The RF coil communicates with an RF system 620 producing the necessary electrical waveforms. The RF coil can be a tunable RF coil that can be tuned to various different resonance frequencies, e.g., resonance frequencies associated with different magnetic field strengths. The RF system 620 can include a broadband receiver capable of receiving magnetic resonance signals across a broad range of resonance frequencies, thereby allowing a similarly broad range of different magnetic field strengths to be implemented.

Still referring to FIG. 6, the magnet assembly 612 also supports three axes of gradient coils (not shown) of a type known in the art, and which communicate with a corresponding gradient system 622 providing electrical power to the gradient coils to produce magnetic field gradients, $G_x$, $G_y$, and $G_z$ over time. A data acquisition system 624 connects to RF reception coils (not shown) that are supported within the magnet assembly 612 or positioned within bore 616. The RF system 620, gradient system 622, and data acquisition system 624 each communicates with a controller 626 that generates pulse sequences that include RF pulses from the RF system 620 and gradient pulses from gradient system 622. The data acquisition system 624 receives magnetic resonance signals from the RF system 620 and provides the magnetic resonance signals to a data processing system 628, which operates to process the magnetic resonance signals and to reconstruct images therefrom. The reconstructed images can be provided to a display 630 for display to a user.

Still referring to FIG. 6, the magnet assembly 612 includes one or more magnet coils 632 housed in a vacuum housing 634, which generally provides a cryostat for the magnet coils 632, and mechanically cooled by a mechanical cryocooler 636, such as a Gifford-McMahon® ("GM") cryocooler or a pulse tube cryocooler. In one example configuration, the cryocooler can be a Model RDK-305 Gifford-McMahon® cryocooler manufactured by Sumitomo Heavy Industries (Japan). In general, the cryocooler 636 is in thermal contact with the magnet coils 632 and is operable to lower the temperature of the magnet coils 632 and to maintain the magnet coils 632 and a desired operating temperature. In some embodiments, the cryocooler 636 includes a first stage in thermal contact with the vacuum housing 634 and a second stage in thermal contact with the magnet coils 632. In these embodiments, the first stage of the cryocooler 636 maintains the vacuum housing 634 at a first temperature and the second stage of the cryocooler 636 maintains the magnet coils 632 at a second temperature that is lower than the first temperature.

Still referring to FIG. 6, the magnet coils 632 are composed of a superconducting material and therefore provide a superconducting magnet. The superconducting material is preferably selected to be a material with a suitable critical temperature such that the magnet coils 632 are capable of achieving desired magnetic field strengths over a range of suitable temperatures. As one example, the superconducting material can be niobium ("Nb"), which has a transition temperature of about 9.2 K. As another example, the superconducting material can be niobium-titanium ("NbTi"), which has a transition temperature of approximately 10 K. As still another example, the superconducting material can be triniobium-tin ("Nb$_3$Sn"), which has a transition temperature of approximately 18.3 K.

Still referring to FIG. 6, the choice of superconducting material will define the range of magnetic field strengths achievable with the magnet assembly 612. Preferably, the superconducting material is chosen such that magnetic field strengths in the range of about 0.0 T to about 3.0 T can be achieved over a range of temperatures that can be suitably achieved by the cryocooler 636. In some configurations, however, the superconducting material can be chosen to provide magnetic field strengths higher than 3.0 T.

Still referring to FIG. 6, the cryocooler 636 is operable to maintain the magnet coils 632 at an operational temperature at which the magnet coils 632 are superconducting, such as a temperature that is below the transition, or critical, temperature for the material of which the magnet coils 632 are composed. As one example, a lower operational temperature limit can be about 4 K and an upper operational temperature limit can be at or near the transition, or critical, temperature of the superconducting material of which the magnet coils 632 are composed.

Still referring to FIG. 6, the current density in the magnet coils 632 in the MRI system 610 is controllable to rapidly ramp up or ramp down the magnetic field 614 generated by the magnet assembly 612 while controlling the temperature of the magnet coils 632 with the cryocooler 636 to keep the temperature below the transition temperature of the superconducting material of which the magnet coils 632 are composed. As one example, the magnetic field 614 can be ramped up or ramped down on the order of minutes, such as fifteen minutes or less. In general, the current density in the magnet coils 632 can be increased or decreased by connecting the magnet coils 632 to a circuit with a power supply 638 that is in electrical communication with the magnet coils 632 via a switch 640 and operating the power supply 638 to increase or decrease the current in the connected circuit. The switch 640 is generally a superconducting switch that is operable between a first, closed, state and a second, open, state. When the switch 640 is in its open state, the magnet coils 632 are in a closed circuit, which is sometimes referred to as a "persistent mode." In this configuration, the magnet coils 632 are in a superconducting state so long as the temperature of the magnet coils 632 is maintained at a temperature at or below the transition temperature of the superconducting material of which they are composed.

Still referring to FIG. 6, when the switch 640 is in the closed state, however, the magnet coils 632 and the power supply 638 can be placed in a connected circuit, and the current supplied by the power supply 638 and the current in the magnet coils 632 will try to equalize. For instance, if the power supply 638 is operated to supply more current to the connected circuit, the current in the magnet coils 632 will increase, which will increase the strength of the magnetic field 614. On the other hand, if the power supply 638 is operated to decrease the current in the connected circuit, the current in the magnet coils 632 will decrease, which will decrease the strength of the magnetic field 614.

Still referring to FIG. 6, appreciated is that any suitable superconducting switch can be used for selectively connecting the magnet coils 632 and power supply 638 into a connected circuit; however, as one non-limiting example, the switch 640 may include a length of superconducting wire that is connected in parallel to the magnet coils 632 and the power supply 638. To operate such a switch 640 into its closed state, a heater in thermal contact with the switch 640 is operated to raise the temperature of the superconducting wire above its transition temperature, which in turn makes the wire highly resistive compared to the inductive impedance of the magnet coils 632. As a result, very little current will flow through the switch 640. The power supply 638 can then be placed into a connected circuit with the magnet coils 632. When in this connected circuit, the current in the power supply 638 and the magnet coils 632 will try to equalize; thus, by adjusting the current supplied by the power supply 638, the current density in the magnet coils 632 can be increased or decreased to respectively ramp up or ramp down the magnetic field 614. To operate the switch 640 into its open state, the superconducting wire in the switch 640 is cooled below its transition temperature, which places the magnet coils 632 back into a closed circuit, thereby disconnecting the power supply 638 and allowing all of the current to flow through the magnet coils 632.

Still referring to FIG. 6, when the magnet coils 632 are in the connected circuit with the power supply 638, the temperature of the magnet coils 632 will increase as the current in the connected circuit equalizes. Thus, the temperature of the magnet coils 632 should be monitored to ensure that the temperature of the magnet coils 632 remains below the transition temperature for the superconducting material of which they are composed. Because placing the magnet coils 632 into a connected circuit with the power supply 638 will tend to increase the temperature of the magnet coils 632, the rate at which the magnetic field 614 can be ramped up or ramped down will depend in part on the cooling capacity of the cryocooler 636. For instance, a cryocooler with a larger cooling capacity will be able to more rapidly remove heat from the magnet coils 632 while they are in a connected circuit with the power supply 638. The power supply 638 and the switch 640 operate under control from the controller 626 to provide current to the magnet coils 632 when the power supply 638 is in a connected circuit with the magnet coils 632. A current monitor 642 measures the current flowing to the magnet coils 632 from the power supply 638, and a measure of the current can be provided to the controller 626 to control the ramping up or ramping down of the magnetic field 614. In some configurations, the current monitor 642 is integrated into the power supply 638.

Still referring to FIG. 6, a temperature monitor 644 is in thermal contact with the magnet assembly 612 and operates to measure a temperature of the magnet coils 632 in real-time. As one example, the temperature monitor 644 can include a thermocouple temperature sensor, a diode temperature sensor, e.g., a silicon diode ($SiO_2$) or a gallium aluminum arsenide (GaAlAs) diode, a resistance temperature detector ("RTD"), a capacitive temperature sensor, etc.

The RTD-based temperature sensors comprise: ceramic oxynitride, germanium, or ruthenium oxide. The temperature of the magnet coils 632 is monitored and can be provided to the controller 626 to control the ramping up or ramping down of the magnetic field 614.

Still referring to FIG. 6, in operation, the controller 626 is programmed to ramp up or ramp down the magnetic field 614 of the magnet assembly 612 in response to instructions from a user. As mentioned above, the magnetic field 614 can be ramped down by decreasing the current density in the magnet coils 632 by supplying current to the magnet coils 632 from the power supply 638 via the switch 640, which is controlled by the controller 626. Likewise, the strength of the magnetic field 614 can be ramped-up by increasing the current density in the magnet coils 632 by supplying current to the magnet coils 632 from the power supply 638 via the switch 640, which is controlled by the controller 626.

Still referring to FIG. 6, the controller 626 is also programmed to monitor various operational parameter values associated with the MRI system 610 before, during, and after ramping the magnetic field 614 up or down. As one example, as mentioned above, the controller 626 can monitor the current supplied to the magnet coils 632 by the power supply 638 via data received from the current monitor 642. As another example, as mentioned above, the controller 626 can monitor the temperature of the magnet coils 632 via data received from the temperature monitor 644. As still another example, the controller 626 can monitor the strength of the magnetic field 614, such as by receiving data from a magnetic field sensor, such as a Hall probe or the like, positioned in or proximate to the bore 616 of the magnet assembly 612.

Still referring to FIG. 6, one or more computer systems can be provided with the MRI system 610 for processing acquired data in accordance with the methods above described. As one example, the data processing system 628 can be used to process the acquired data. For example, the data processing system 628 can receive magnetic resonance data from the data acquisition system 624 and the process magnetic resonance data in accordance with instructions downloaded from an operator workstation. Such processing may include those methods described above for reconstructing images, fitting signals to signal models, generating dispersion data, and computing quantitative or physical parameters from dispersion data. Images, reconstructed by the data processing system 628, are reconveyed, or conveyed-back, to the operator workstation for storage; and real-time images are stored in a memory, from which the real-time images are output to display 630.

Still referring to FIG. 6, the MRI system 610 may also include one or more networked workstations. By way of example, a networked workstation may include a display; one or more input devices, such as a keyboard and mouse; and a processor. The networked workstation may be located within the same facility as the MRI system 610, or in a different facility, such as a different healthcare institution or clinic.]The networked workstation, whether within the same facility or in a different facility as the MRI system 610, may gain remote access to the data processing system 628 via a communication system. Accordingly, multiple networked workstations may have access to the data processing system 628. In this manner, magnetic resonance data, reconstructed images, or other data may be exchanged between the data processing system 628 and the networked workstations, such that the data or images may be remotely processed by a networked workstation. This data may be exchanged in any suitable format, such as in accordance with the transmission control protocol ("TCP"), the internet protocol ("IP"), or other known or suitable protocols.

Figure 7:
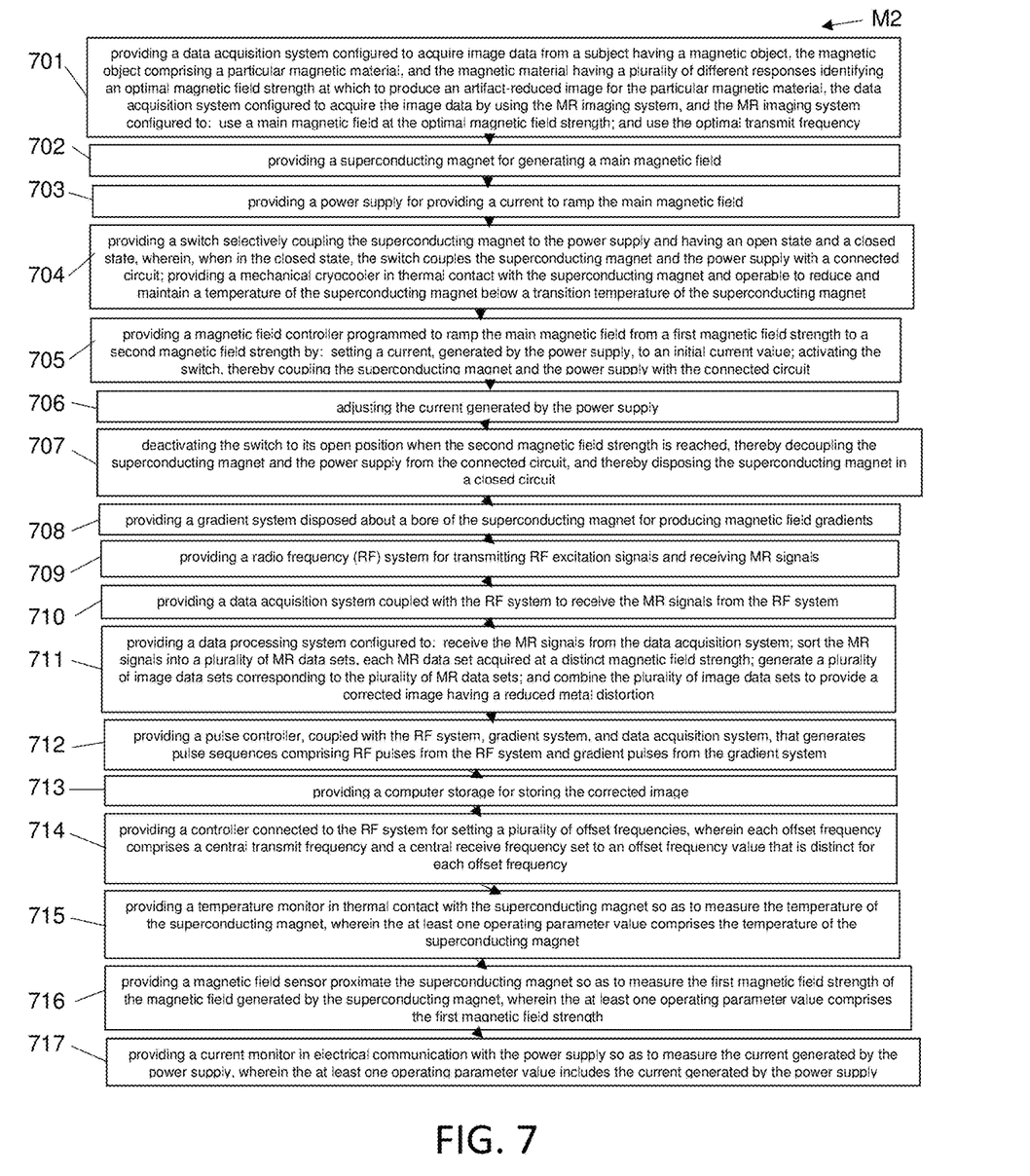
FIG. 7 is a flow diagram illustrating a method of providing a method of providing a magnetic resonance (MR) imaging system, in accordance with an embodiment of the present disclosure.

Referring to FIG. 7, this flow diagram illustrates a method M2 providing a magnetic resonance (MR) imaging system, e.g., the MRI system 610, for imaging near a magnetic material to produce an artifact-reduced image, in accordance with an embodiment of the present disclosure. The method M2 comprises: providing a data acquisition system 624 configured to acquire image data from a subject having a magnetic object, the magnetic object comprising a particular magnetic material, and the magnetic material having a plurality of different responses identifying an optimal magnetic field strength at which to produce an artifact-reduced image for the particular magnetic material, the data acquisition system configured to acquire the image data by using the MR imaging system, and the MR imaging system configured to: use a main magnetic field at the optimal magnetic field strength; and use the optimal transmit frequency, as indicated by block 701.

Still referring to FIG. 7, the method M2 further comprises: providing a superconducting magnet for generating a main magnetic field, as indicated by block 702; providing a power supply for providing a current to ramp the main magnetic field, as indicated by block 703; providing a switch selectively coupling the superconducting magnet to the power supply and having an open state and a closed state, wherein, when in the closed state, the switch couples the superconducting magnet and the power supply with a connected circuit; providing a mechanical cryocooler in thermal contact with the superconducting magnet and operable to reduce and maintain a temperature of the superconducting magnet below a transition temperature of the superconducting magnet, as indicated by block 703; providing a magnetic field controller programmed to ramp the main magnetic field from a first magnetic field strength to a second magnetic field strength by: setting a current, generated by the power supply, to an initial current value; activating the switch, thereby coupling the superconducting magnet and the power supply with the connected circuit, as indicated by block 704; adjusting the current generated by the power supply, as indicated by block 705; and deactivating the switch to its open position when the second magnetic field strength is reached, thereby decoupling the superconducting magnet and the power supply from the connected circuit, and thereby disposing the superconducting magnet in a closed circuit, as indicated by block 705; providing a gradient system disposed about a bore of the superconducting magnet for producing magnetic field gradients, as indicated by block 706; providing a radio frequency (RF) system for transmitting RF excitation signals and receiving MR signals, as indicated by block 707; providing a data acquisition system coupled with the RF system to receive the MR signals from the RF system, as indicated by block 708; providing a data processing system configured to: receive the MR signals from the data acquisition system; sort the MR signals into a plurality of MR data sets, each MR data set acquired at a distinct magnetic field strength; generate a plurality of image data sets corresponding to the plurality of MR data sets; and combine the plurality of image data sets to provide a corrected image having a reduced metal distortion, as indicated by block 709; providing a pulse controller, coupled with the RF system, gradient system, and data acquisition system, that generates pulse sequences comprising RF pulses from the RF system and gradient pulses from the gradient system, as indicated by block 710; and providing a computer storage for storing the corrected image, as indicated by block 711; and providing a controller connected to the RF system for setting a plurality of offset frequencies, wherein each offset frequency comprises a central transmit frequency and a central receive frequency set to an offset frequency value that is distinct for each offset frequency, as indicated by block 712.

Still referring to FIG. 7, in the method M2, the MR data sets further comprise the MR signals received for the offset frequencies. The switch comprises a superconducting switch. The magnetic field controller is programmed to receive at least one operating parameter value indicative of a present state of the MR imaging system and to select the ramp function based on the at least one operating parameter value and the second magnetic field strength. The method M2 further comprising at least one of: providing a temperature monitor in thermal contact with the superconducting magnet so as to measure the temperature of the superconducting magnet, wherein the at least one operating parameter value comprises the temperature of the superconducting magnet, as indicated by block 713; providing a magnetic field sensor proximate the superconducting magnet so as to measure the first magnetic field strength of the magnetic field generated by the superconducting magnet, wherein the at least one operating parameter value comprises the first magnetic field strength, as indicated by block 714; and providing a current monitor in electrical communication with the power supply so as to measure the current generated by the power supply, wherein the at least one operating parameter value includes the current generated by the power supply, as indicated by block 715.

Generally, a computer, computer system, computing device, client or server, as will be well understood by a person skilled in the art, includes one or more than one electronic computer processor, and may include separate memory, and one or more input and/or output (I/O) devices (or peripherals) that are in electronic communication with the one or more processor(s). The electronic communication may be facilitated by, for example, one or more busses, or other wired or wireless connections. In the case of multiple processors, the processors may be tightly coupled, e.g. by high-speed busses, or loosely coupled, e.g., by being connected by a wide-area network.

A computer processor, or just "processor", is a hardware device for performing digital computations. It is the express intent of the inventors that a "processor" does not include a human; rather it is limited to be an electronic device, or devices, that perform digital computations. A programmable processor is adapted to execute software, which is typically stored in a computer-readable memory. Processors are generally semiconductor based microprocessors, in the form of microchips or chip sets. Processors may alternatively be completely implemented in hardware, with hard-wired functionality, or in a hybrid device, such as field-programmable gate arrays or programmable logic arrays. Processors may be general-purpose or special-purpose off-the-shelf commercial products, or customized application-specific integrated circuits (ASICs). Unless otherwise stated, or required in the context, any reference to software running on a programmable processor shall be understood to include purpose-built hardware that implements all the stated software functions completely in hardware.

Multiple computers (also referred to as computer systems, computing devices, clients and servers) may be networked via a computer network, which may also be referred to as an electronic network or an electronic communications network. When they are relatively close together the network may be a local area network (LAN), for example, using Ethernet. When they are remotely located, the network may be a wide area network (WAN), such as the internet, that computers may connect to via a modem, or they may connect to through a LAN that they are directly connected to.

Computer-readable memory, which may also be referred to as a computer-readable medium or a computer-readable storage medium, which terms have identical (equivalent) meanings herein, can include any one or a combination of non-transitory, tangible memory elements, such as random access memory (RAM), which may be DRAM, SRAM, SDRAM, etc., and nonvolatile memory elements, such as a ROM, PROM, FPROM, OTP NVM, EPROM, EEPROM, hard disk drive, solid state disk, magnetic tape, CDROM, DVD, etc. Memory may employ electronic, magnetic, optical, and/or other technologies, but excludes transitory propagating signals so that all references to computer-readable memory exclude transitory propagating signals. Memory may be distributed such that at least two components are remote from one another, but are still all accessible by one or more processors. A nonvolatile computer-readable memory refers to a computer-readable memory (and equivalent terms) that can retain information stored in the memory when it is not powered. A computer-readable memory is a physical, tangible object that is a composition of matter. The storage of data, which may be computer instructions, or software, in a computer-readable memory physically transforms that computer-readable memory by physically modifying it to store the data or software that can later be read and used to cause a processor to perform the functions specified by the software or to otherwise make the data available for use by the processor. In the case of software, the executable instructions are thereby tangibly embodied on the computer-readable memory. The express intent of the present disclosure is that in any claim to a computer-readable memory, the computer-readable memory, being a physical object that has been transformed to record the elements recited as being stored thereon, is an essential element of the claim.

Software may include one or more separate computer programs configured to provide a sequence, or a plurality of sequences, of instructions to one or more processors to cause the processors to perform computations, control other devices, receive input, send output, etc.

Intended is that the present disclosure includes computer-readable memory containing any or all of the software described herein. In particular, the present disclosure includes such software stored on non-volatile computer-readable memory that may be used to distribute or sell embodiments of the present disclosure or parts thereof.

While the applicant's teachings described herein are in conjunction with various embodiments for illustrative purposes, the applicant's teachings are not intended to be limited to such embodiments. On the contrary, the applicant's teachings described and illustrated herein encompass various alternatives, modifications, and equivalents, without departing from the embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

What is claimed:

1. A method of imaging near a magnetic material to produce an artifact-reduced image by using a magnetic resonance (MR) imaging system, the method comprising:

acquiring image data from a subject having a magnetic object, the magnetic object comprising a particular magnetic material, and the magnetic material having a plurality of different responses identifying an optimal magnetic field strength at which to produce the artifact-reduced image for the particular magnetic material, acquiring the image data comprising using the MR imaging system, and using the MR imaging system comprising:

using a main magnetic field at the optimal magnetic field strength; and using an optimal transmit frequency, wherein acquiring the image data further comprises:

acquiring a first image data from a subject having a magnetic object by using an MR imaging system having a main magnetic field at a first magnetic field strength and using a first transmit frequency, the magnetic object comprising a particular magnetic material;

adjusting the main magnetic field of the MRI system to a second magnetic field strength; and acquiring a second image data from the subject by using the MR imaging system while the main magnetic field of the MR imaging system is at the second magnetic field strength.

2. The method of claim 1, wherein acquiring the image data further comprises combining the first image data and the second image data to provide a corrected image having a reduced distortion, the second magnetic field strength less than the first magnetic field strength, the second transmit frequency comprising a resonant frequency and at least one offset frequency, and the number of offset frequencies of the first transmit frequency less than the number of offset frequencies of the second transmit frequency; and using a second transmit frequency while the main magnetic field of the MR imaging system is at the second magnetic field strength.

3. The method of claim 2, wherein the first transmit frequency comprises a resonant frequency and at least one offset frequency, and wherein the first image data comprises a sum of the image data from the resonant frequency and the at least one offset frequency.

4. The method of claim 3, wherein the second transmit frequency comprises a resonant frequency and at least one offset frequency, and wherein the second image data comprises a sum of the image data from the resonant frequency and the at least one offset frequency.

5. The method of claim 2 wherein the first magnetic field strength and the second magnetic field strength are selected based on at least one of a tissue and a magnetic implant.

6. The method of claim 2, wherein the magnetic field is adjusted to the second magnetic field strength by:

selecting a ramp function defining at least one ramp rate;

setting a current generated by a power supply to an initial current value;

activating a superconducting switch, thereby coupling a superconducting magnet of the MR imaging system and the power supply with a connected circuit;

adjusting the current generated by the power supply according to the selected ramp function; and deactivating the superconducting switch when the second magnetic field strength is reached, thereby decoupling the superconducting magnet and the power supply from the connected circuit, and thereby disposing the superconducting magnet in a closed circuit.

7. The method of claim 6, wherein selecting a ramp function comprises selecting a short ramp time for adjusting the magnetic field to the second magnetic field strength.

8. A magnetic resonance (MR) imaging system for imaging near a magnetic material to produce an artifact-reduced image, the system comprising:

a data acquisition system configured to acquire image data from a subject having a magnetic object, the magnetic object comprising a particular magnetic material, and the magnetic material having a plurality of different responses identifying an optimal magnetic field strength at which to produce an artifact-reduced image for the particular magnetic material, the data acquisition system configured to acquire the image data by using the MR imaging system, and the MR imaging system configured to:

use a main magnetic field at the optimal magnetic field strength; and use an optimal transmit frequency, wherein the MR imaging system is further configured to:

acquire a first image data from a subject having a magnetic object by using a main magnetic field at a first magnetic field strength and using a first transmit frequency, the magnetic object comprising a particular magnetic material;

adjust the main magnetic field to a second magnetic field strength; and acquire a second image data from the subject while the main magnetic field of the MR imaging system is at the second magnetic field strength.

9. The system of claim 8, further comprising:

a superconducting magnet for generating a main magnetic field;

a power supply for providing a current to ramp the main magnetic field;

a switch selectively coupling the superconducting magnet with the power supply and having an open state and a closed state, wherein, when in the closed state, the switch couples the superconducting magnet and the power supply with a connected circuit;

a mechanical cryocooler in thermal contact with the superconducting magnet and operable to reduce and maintain a temperature of the superconducting magnet below a transition temperature of the superconducting magnet;

a magnetic field controller programmed to ramp the main magnetic field from a first magnetic field strength to a second magnetic field strength by:

setting a current generated by the power supply to an initial current value;

activating the switch, thereby coupling the superconducting magnet and the power supply with the connected circuit;

adjusting the current generated by the power supply; and deactivating the switch when the second magnetic field strength is reached, thereby decoupling the superconducting magnet and the power supply from the connected circuit, and thereby disposing the superconducting magnet in a closed circuit;

a gradient system disposed about a bore of the superconducting magnet for producing magnetic field gradients;

a data processing system configured to:

receive the MR signals from the data acquisition system;

sort the MR signals into a plurality of MR data sets, each MR data set acquired at a distinct magnetic field strength;

generate a plurality of image data sets corresponding to the plurality of MR data sets; and combine the plurality of image data sets to provide a corrected image having a reduced distortion;

a pulse controller, coupled with a radio-frequency (RF) system, gradient system, and data acquisition system, that generates pulse sequences comprising RF pulses from the RF system and gradient pulses from the gradient system;

a computer storage for storing the corrected image; and a controller coupled with the RF system for setting a plurality of offset frequencies, wherein each offset frequency comprises a central transmit frequency and a central receive frequency set to an offset frequency value that is distinct for each offset frequency, wherein the data acquisition system is further configured to receive the MR signals from the RF system, and wherein the MR imaging system is further configured to combine the first image data and the second image data to provide a corrected image having a reduced distortion, the second magnetic field strength less than the first magnetic field strength, the second transmit frequency comprising a resonant frequency and at least one offset frequency, and the number of offset frequencies of the first transmit frequency less than the number of offset frequencies of the second transmit frequency; and using a second transmit frequency while the main magnetic field of the MR imaging system is at the second magnetic field strength.

10. The system of claim 9, wherein the MR data sets further comprise the MR signals received for the offset frequencies.

11. The system of claim 9, wherein the switch comprises a superconducting switch.

12. The system of claim 9, wherein the magnetic field controller is programmed to: receive at least one operating parameter value indicative of a present state of the MR imaging system; and select the ramp function based on the at least one operating parameter value and the second magnetic field strength.

13. The system of claim 12, further comprising a temperature monitor in thermal contact with the superconducting magnet so as to measure the temperature of the superconducting magnet, wherein the at least one operating parameter value comprises the temperature of the superconducting magnet.

14. The system of claim 12, further comprising a magnetic field sensor proximate the superconducting magnet so as to measure the first magnetic field strength of the magnetic field generated by the superconducting magnet, wherein the at least one operating parameter value comprises the first magnetic field strength.

15. The system of claim 12, further comprising a current monitor in electrical communication with the power supply so as to measure the current generated by the power supply, wherein the at least one operating parameter value comprises the current generated by the power supply.

16. A method of providing a magnetic resonance (MR) imaging system for imaging near a magnetic material to produce an artifact-reduced image, the method comprising:

providing a data acquisition system configured to acquire image data from a subject having a magnetic object, the magnetic object comprising a particular magnetic material, and the magnetic material having a plurality of different responses identifying an optimal magnetic field strength at which to produce an artifact-reduced image for the particular magnetic material, the data acquisition system configured to acquire the image data by using the MR imaging system, and the MR imaging system configured to:

use a main magnetic field at the optimal magnetic field strength; and use an optimal transmit frequency, wherein using the MR imaging system comprises:

acquiring a first image data from a subject having a magnetic object by using a main magnetic field at a first magnetic field strength and using a first transmit frequency, the magnetic object comprising a particular magnetic material;

adjusting the main magnetic field to a second magnetic field strength; and acquiring a second image data from the subject while the main magnetic field of the MR imaging system is at the second magnetic field strength.

17. The method of claim 16, further comprising:

providing a superconducting magnet for generating a main magnetic field;

providing a power supply for providing a current to ramp the main magnetic field;

providing a switch selectively coupling the superconducting magnet to the power supply and having an open state and a closed state, wherein, when in the closed state, the switch couples the superconducting magnet and the power supply with a connected circuit;

providing a mechanical cryocooler in thermal contact with the superconducting magnet and operable to reduce and maintain a temperature of the superconducting magnet below a transition temperature of the superconducting magnet;

providing a magnetic field controller programmed to ramp the main magnetic field from a first magnetic field strength to a second magnetic field strength by:

setting a current, generated by the power supply, to an initial current value;

activating the switch, thereby coupling the superconducting magnet and the power supply with the connected circuit;

adjusting the current generated by the power supply; and deactivating the switch to its open position when the second magnetic field strength is reached, thereby decoupling the superconducting magnet and the power supply from the connected circuit, and thereby disposing the superconducting magnet in a closed circuit;

providing a gradient system disposed about a bore of the superconducting magnet for producing magnetic field gradients;

providing a radio frequency (RF) system for transmitting RF excitation signals and receiving MR signals;

providing a data acquisition system coupled with the RF system to receive the MR signals from the RF system;

providing a data processing system configured to:

receive the MR signals from the data acquisition system;

sort the MR signals into a plurality of MR data sets, each MR data set acquired at a distinct magnetic field strength;

generate a plurality of image data sets corresponding to the plurality of MR data sets; and combine the plurality of image data sets to provide a corrected image having a reduced metal distortion;

providing a pulse controller, coupled with the RF system, gradient system, and data acquisition system, that generates pulse sequences comprising RF pulses from the RF system and gradient pulses from the gradient system; and providing a computer storage for storing the corrected image providing a controller connected to the RF system for setting a plurality of offset frequencies, wherein each offset frequency comprises a central transmit frequency and a central receive frequency set to an offset frequency value that is distinct for each offset frequency, and wherein using the MR imaging system further comprises combining the first image data and the second image data to provide a corrected image having a reduced distortion, the second magnetic field strength less than the first magnetic field strength, the second transmit frequency comprising a resonant frequency and at least one offset frequency, and the number of offset frequencies of the first transmit frequency less than the number of offset frequencies of the second transmit frequency; and using a second transmit frequency while the main magnetic field of the MR imaging system is at the second magnetic field strength.

18. The method of claim 17, wherein the MR data sets further comprise the MR signals received for the offset frequencies.

19. The method of claim 17, wherein the switch is a superconducting switch, and wherein the magnetic field controller is programmed to receive at least one operating parameter value indicative of a present state of the MR imaging system and to select the ramp function based on the at least one operating parameter value and the second magnetic field strength.

20. The method of claim 17, further comprising at least one of:

providing a temperature monitor in thermal contact with the superconducting magnet so as to measure the temperature of the superconducting magnet, wherein the at least one operating parameter value comprises the temperature of the superconducting magnet;

providing a magnetic field sensor proximate the superconducting magnet so as to measure the first magnetic field strength of the magnetic field generated by the superconducting magnet, wherein the at least one operating parameter value comprises the first magnetic field strength; and providing a current monitor in electrical communication with the power supply so as to measure the current generated by the power supply, wherein the at least one operating parameter value includes the current generated by the power supply.

* * * * *